(12) United States Patent
Pan et al.

(10) Patent No.: US 12,310,069 B2
(45) Date of Patent: May 20, 2025

(54) IGBT DEVICE AND METHOD OF MAKING THE SAME

(71) Applicant: Shanghai Huahong Grace Semiconductor Manufacturing Corporation, Shanghai (CN)

(72) Inventors: Jia Pan, Shanghai (CN); Tongbo Zhang, Shanghai (CN); Yiping Yao, Shanghai (CN); Jiye Yang, Shanghai (CN); Junjun Xing, Shanghai (CN); Chong Chen, Shanghai (CN); Xuan Huang, Shanghai (CN); Peng Sun, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 498 days.

(21) Appl. No.: 17/942,533

(22) Filed: Sep. 12, 2022

(65) Prior Publication Data
US 2023/0101771 A1    Mar. 30, 2023

(30) Foreign Application Priority Data
Sep. 27, 2021   (CN) .......................... 202111148401.8

(51) Int. Cl.
| | |
|---|---|
| *H10D 62/10* | (2025.01) |
| *H01L 21/265* | (2006.01) |
| *H10D 12/00* | (2025.01) |
| *H10D 12/01* | (2025.01) |
| *H10D 62/17* | (2025.01) |

(52) U.S. Cl.
CPC ...... *H10D 62/111* (2025.01); *H01L 21/26513* (2013.01); *H10D 12/038* (2025.01); *H10D 12/481* (2025.01); *H10D 62/393* (2025.01)

(58) Field of Classification Search
CPC .. H10D 12/038; H10D 12/481; H10D 62/111; H10D 62/393; H01L 21/26513
USPC .......................................................... 257/78
See application file for complete search history.

(56) References Cited

U.S. PATENT DOCUMENTS

| | | | |
|---|---|---|---|
| 2014/0077255 A1* | 3/2014 | Naijo ................... | H10D 12/481 257/773 |
| 2017/0047319 A1* | 2/2017 | Naito ....................... | H10D 8/50 |
| 2017/0221989 A1* | 8/2017 | Hirler ................. | H10D 30/668 |
| 2020/0235230 A1* | 7/2020 | Zhang ................. | H10D 12/038 |

\* cited by examiner

*Primary Examiner* — Igwe U Anya
(74) *Attorney, Agent, or Firm* — Harris Beach Murtha Cullina PLLC

(57) ABSTRACT

An IGBT device and a method for manufacturing it, the device includes a super junction structure that has several N-type pillars and P-type pillars arranged alternately; a cell unit that is located in an N-type epitaxial layer, and the N-type epitaxial layer is located above the N-type substrate; each cell unit includes a trench gate, a P-type body region, and a source region; an N-type carrier injection layer, the N-type carrier injection layer is located in the N-type epitaxial layer, and the N-type carrier injection layer is spaced apart from the N-type substrate by the N-type epitaxial layer; the bottom of the P-type body region is located in the N-type carrier injection layer; and a collector region that is located at the bottom of the N-type substrate.

9 Claims, 5 Drawing Sheets

IGBT DEVICE AND METHOD OF MAKING THE SAME

CROSS-REFERENCES TO RELATED APPLICATIONS

This application claims priority to Chinese patent application No. CN 202111148401.8 filed at CNIPA on Sep. 27, 2021, and entitled "IGBT DEVICE AND METHOD OF MAKING THE SAME", the disclosure of which is incorporated herein by reference in its entirety.

TECHNICAL FIELD

The present application relates to the field of semiconductor manufacturing, in particular to an IGBT device and a method for manufacturing the same.

BACKGROUND

The Insulated Gate Bipolar Transistor (IGBT) device has the characteristics such as a small on-state voltage drop, a large current capacity, high input impedance, a fast response speed, and simple control, and is widely applied to fields such as transportation, medical treatment, and new energy.

The IGBT is one of the important switching components for energy control and conversion in power electronic systems, and the performance thereof directly affects the conversion efficiency, volume, and weight of the power electronic systems. The performance of power electronic devices pursues higher current density, a smaller on-state voltage drop, and a lower turn-off loss in the development process.

SUMMARY

In order to solve the technical problem in the prior art, the present application provides an IGBT device and a method for manufacturing the same. The technical solutions as follows:

According to a first aspect, an embodiment of the present application provides an IGBT device, including:
  a super junction structure, the super junction structure being composed of several N-type pillars and P-type pillars arranged alternately, and the super junction structure being located in an N-type substrate;
  a cell unit of the IGBT device, the cell unit being located in an N-type epitaxial layer, and the N-type epitaxial layer being located above the N-type substrate;
  each cell unit including a trench gate, a P-type body region, and a source region at the top of the P-type body region;
  an N-type carrier injection layer, the N-type carrier injection layer being located in the N-type epitaxial layer, and the N-type carrier injection layer being spaced apart from the N-type substrate by the N-type epitaxial layer;
  the bottom of the P-type body region being located in the N-type carrier injection layer; and
  a collector region, the collector region being located at the bottom of the N-type substrate.

Optionally, the IGBT device further includes an interlayer dielectric layer and a front metal layer.

The interlayer dielectric layer is located above the N-type epitaxial layer, and the front metal layer is located on the surface of the interlayer dielectric layer.

A contact is formed in the interlayer dielectric layer, and the source region and the trench gate are connected to the front metal layer by means of the contact.

Optionally, a doping impurity of the N-type carrier injection layer is phosphorus.

According to a first aspect, an embodiment of the present application provides a method for manufacturing an IGBT device, wherein the method includes:
  forming a super junction structure in an N-type substrate, the super-junction structure being composed of several N-type pillars and P-type pillars arranged alternately;
  forming an N-type epitaxial layer on the surface of the N-type substrate;
  forming an N-type carrier injection layer in the N-type epitaxial layer, the N-type carrier injection layer being spaced apart from the N-type substrate by the N-type epitaxial layer;
  forming a cell unit of the IGBT device in the N-type epitaxial layer, each cell unit including a trench gate, a P-type body region, and a source region located at the top of the P-type body region, and the bottom of the P-type body region being located in the N-type carrier injection layer; and
  forming a collector region at the bottom of the N-type substrate.

Optionally, the forming an N-type carrier injection layer in the N-type epitaxial layer includes:
  implanting N-type dopant ions into the N-type epitaxial layer by means of an ion implantation process, so as to form the N-type carrier injection layer.

Optionally, the N-type dopant ions are phosphorus ions.

Optionally, in the process of forming the N-type carrier injection layer, an ion implantation dose is $1\text{E}11\text{-}1\text{E}14\ \text{cm}^{-2}$, and an ion implantation energy is 1-3 MeV.

Optionally, the forming a cell unit of the IGBT device in the N-type epitaxial layer includes:
  forming a trench gate in the N-type epitaxial layer;
  forming a P-type body region outside the trench gate, the bottom of the P-type body region being located in the N-type carrier injection layer; and
  forming a source region at the top of the P-type body region.

Optionally, the method further includes:
  forming an interlayer dielectric layer;
  forming a contact in the interlayer dielectric layer; and
  forming a front metal layer on the surface of the interlayer dielectric layer, the source region and the trench gate in the cell unit being connected to the front metal layer by means of the contact.

The technical solutions of the present application have at least the following advantages:

By adding the N-type carrier injection layer, the potential of a region corresponding to the P-type body region is increased, achieving a blocking effect on holes injected from a collector. The holes injected from the collector region on the back of the IGBT device into a drift region may move through the drift region to the P-type body region near an IGBT emitter. When the holes reach the N-type carrier injection layer, due to the blocking effect of a potential barrier, the holes gather near the N-type carrier injection layer. By increasing the hole concentration, the on-state voltage drop of the IGBT device is reduced, and the figure of merit (FOM) of the IGBT device is improved.

BRIEF DESCRIPTION OF THE DRAWINGS

In order to more clearly explain the specific implementations of the present application or the technical solution in the prior art, the drawings required in description of the specific implementations or the prior art will be briefly described below. It is obvious that the drawings described below are some implementations of the present application, and those skilled in the art could also obtain other drawings on the basis of these drawings, without involving any inventive skill.

DETAILED DESCRIPTION

Figure 1:
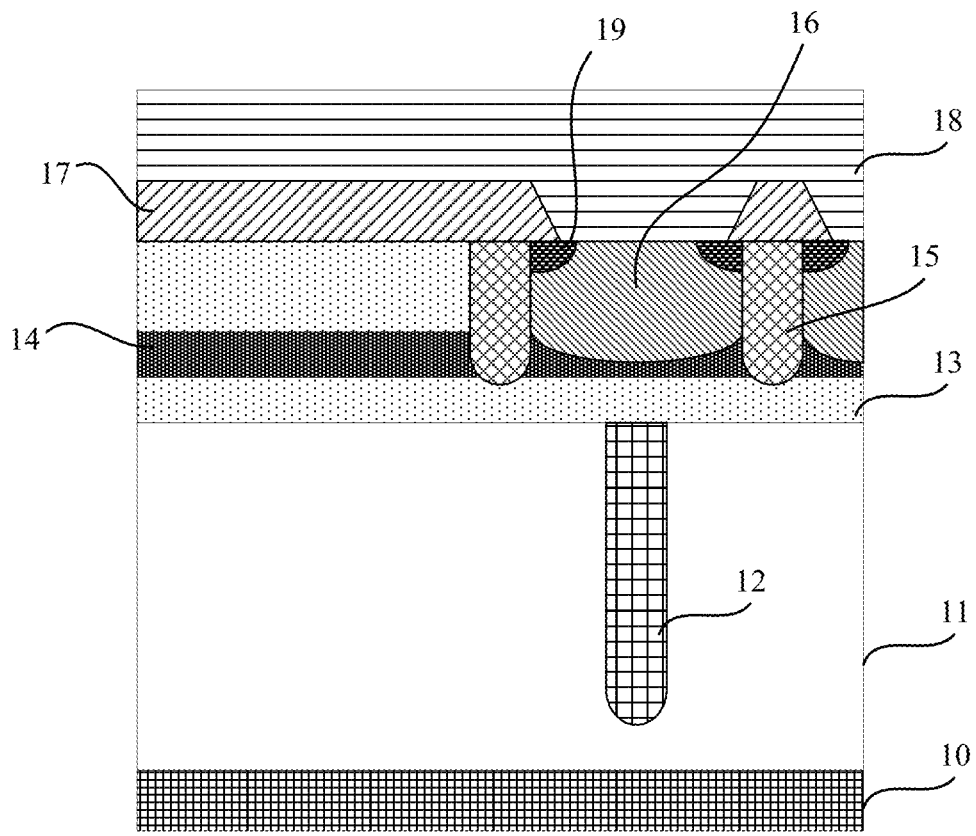
FIG. 1 is a sectional view of an IGBT device provided by an embodiment of the present application.

The technical solutions of the present application will be clearly and completely described below with reference to the drawings. Obviously, the described embodiments are part of the embodiments of the present application, rather than all of them. Based on the embodiments in the present application, all other embodiments obtained by those skilled in the art without involving any inventive skill shall fall into the protection scope of the present application.

In the description of the present application, it should be noted that the orientation or position relationship indicated by the terms "center", "upper", "lower", "left", "right", "vertical", "horizontal", "inner", "outer", etc. is based on the orientation or position relationship shown in the drawings, intended only for the convenience of describing the present application and simplifying the description, rather than indicating or implying that the apparatus or element referred to necessarily has a specific orientation or is configured or operated in a specific orientation, and thus cannot be construed as a limitation on the present application. In addition, the terms "first", "second", and "third" are used for descriptive purposes only, and cannot be construed as indicating or implying relative importance.

In the description of the present application, it should be noted that, unless otherwise clearly specified and limited, the terms "mounting", "coupling", and "connecting" should be understood in a broad sense, for example, it can be a fixed connection, a detachable connection, or an integrated connection, can be a mechanical connection or an electrical connection, can be a direct connection, an indirect connection implemented by means of an intermedium, or an internal connection between two components, and can be a wireless connection or a wired connection. Those skilled in the art could understand the specific meanings of the above terms in the present application on the basis of specific situations.

In addition, the technical features involved in different embodiments of the present application described below can be combined with each other in the case of no conflict.

Please refer to FIG. 1, which illustrates a schematic structural diagram of an IGBT device provided by an embodiment of the present application. The IGBT device includes a super junction structure, a cell unit of the IGBT device, an N-type carrier injection layer 14, and a collector region 10.

The super junction structure is located in an N-type substrate 11. The super junction structure is composed of several N-type pillars and P-type pillars 12 arranged alternately, and the N-type pillar is composed of the N-type substrate between adjacent P-type pillars 12.

Each cell unit of the IGBT device is located in an N-type epitaxial layer 13, and the N-type epitaxial layer 13 is located above the N-type substrate 11.

Each cell unit includes a trench gate 15, a P-type body region 16, and a source region 19 at the top of the P-type body region 16.

The source region 19 is composed of an N+ region.

The trench gate 15 includes a gate trench, a gate dielectric layer covering the bottom surface and side surface of the gate trench, and polysilicon filling the gate trench.

Optionally, the gate dielectric layer is a gate oxide layer.

The N-type carrier injection layer 14 is located in the N-type epitaxial layer 13, and the N-type carrier injection layer 14 is spaced apart from the N-type substrate 11 by the N-type epitaxial layer 13.

Referring to FIG. 1, the P-type body region 16 is spaced apart from the P-type pillar 12 by the N-type carrier injection layer 14.

The collector region 10 is located at the bottom of the N-type substrate 11.

In the IGBT device provided by the embodiment of the present application, by adding the N-type carrier injection layer, the potential of a region corresponding to the P-type body region is increased, achieving a blocking effect on holes injected from a collector. The holes injected from the collector region on the back of the IGBT device into a drift region may move through the drift region to the P-type body region near an IGBT emitter. When the holes reach the N-type carrier injection layer, due to the blocking effect of a potential barrier, the holes gather near the N-type carrier injection layer. By increasing the hole concentration, the on-state voltage drop of the IGBT device is reduced, and the figure of merit (FOM) of the IGBT device is improved.

Referring to FIG. 1, the IGBT device further includes an interlayer dielectric layer 17 and a front metal layer 18.

The interlayer dielectric layer 17 is located above the N-type epitaxial layer 13, and the front metal layer 18 is located on the surface of the interlayer dielectric layer 17.

A contact is formed in the interlayer dielectric layer 17, and the source region 19 and the trench gate are connected to the front metal layer 18 by means of the contact.

The source region is connected to the front metal layer by means of the contact, so as to form the emitter of the IGBT device.

Optionally, a doping impurity of the N-type carrier injection layer is phosphorus.

Figure 2:
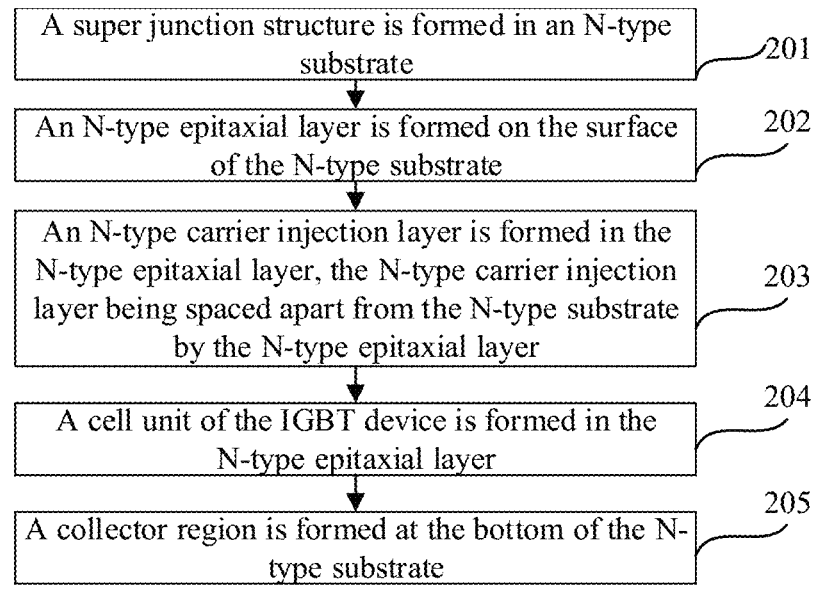
FIG. 2 is a flowchart of a method for manufacturing an IGBT device provided by an embodiment of the present application.

Please refer to FIG. 2, which illustrates a flowchart of a method for manufacturing an IGBT device provided by an embodiment of the present application. The method includes at least the following steps.

Step 201. A super junction structure is formed in an N-type substrate.

Figure 3:
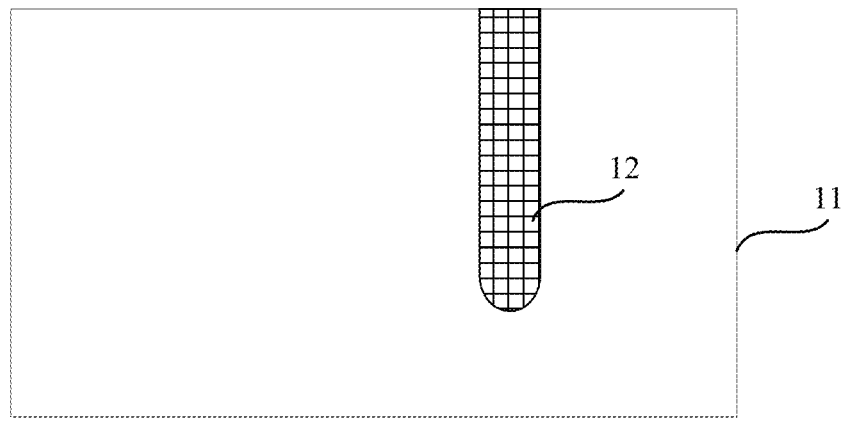
FIG. 3 is a sectional view of the device with a formed super junction structure provided by the embodiment of the present application.

Referring to FIG. 3, the super junction structure is formed in the N-type substrate 11. The super junction structure is composed of several P-type pillars 12 and N-type pillars arranged alternately, and the N-type pillar is composed of the N-type substrate 11 between adjacent P-type pillars 12.

Step 202. An N-type epitaxial layer is formed on the surface of the N-type substrate.

Optionally, the N-type epitaxial layer is formed on the surface of the N-type substrate by means of an epitaxial growth process.

Figure 4:
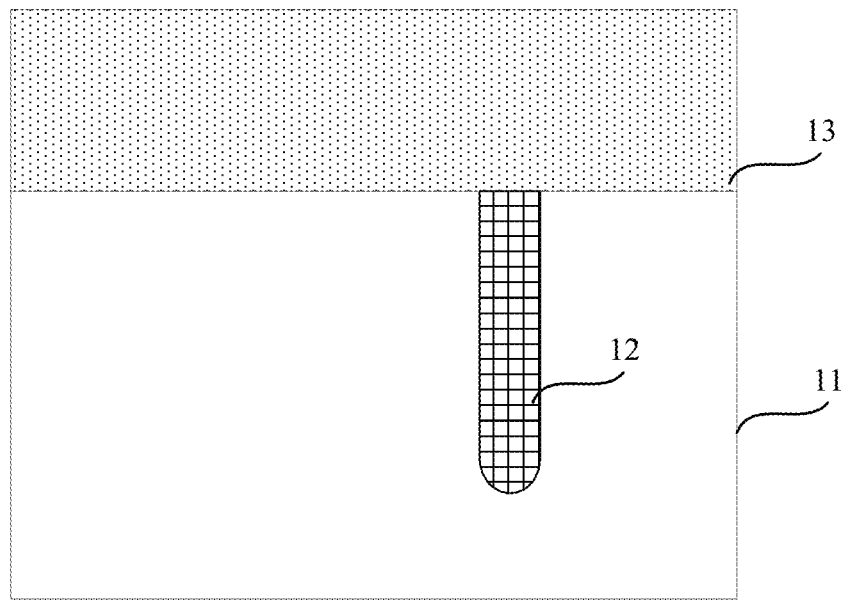
FIG. 4 is a sectional view of the device with a formed N-type epitaxial layer provided by the embodiment of the present application.

Referring to FIG. 4, the N-type epitaxial layer 13 is formed on the surface of the N-type substrate 11.

Step 203. An N-type carrier injection layer is formed in the N-type epitaxial layer, the N-type carrier injection layer being spaced apart from the N-type substrate by the N-type epitaxial layer.

Figure 5:
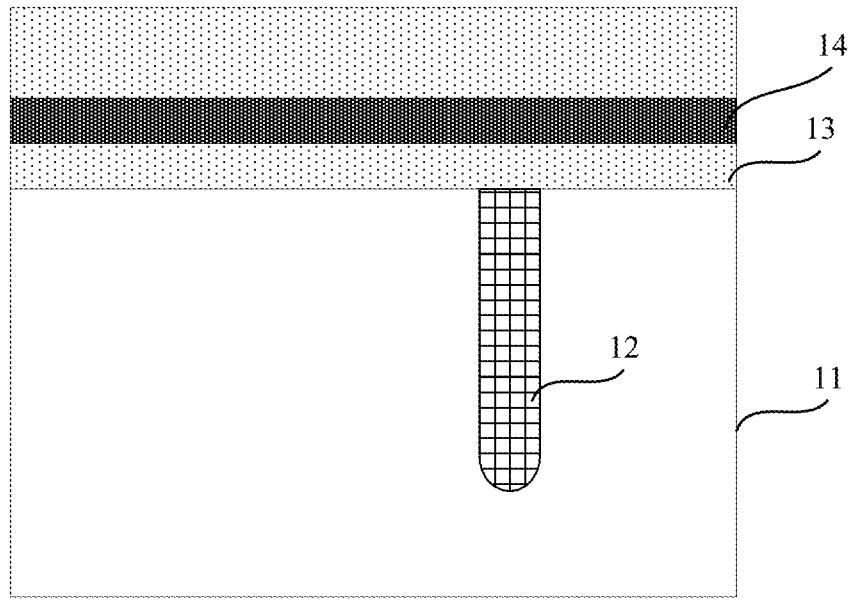
FIG. 5 is a sectional view of the device with an N-type carrier injection layer formed in the N-type epitaxial layer provided by the embodiment of the present application.

Referring to FIG. 5, the N-type carrier injection layer 14 is formed in the N-type epitaxial layer 13, and the N-type epitaxial layer 13 is provided between the N-type carrier injection layer 14 and the P-type pillar 12.

Step 204. A cell unit of the IGBT device is formed in the N-type epitaxial layer.

Each cell unit includes a trench gate, a P-type body region, and a source region located at the top of the P-type body region, and the bottom of the P-type body region is located in the N-type carrier injection layer.

A gate trench is formed in the N-type epitaxial layer by means of photolithography and etching processes, so as to form a gate dielectric layer. The gate dielectric layer covers the bottom surface and side surface of the gate trench. Polysilicon is deposited to fill the gate trench. The substrate is planarized to form the trench gate.

The P-type body region is formed in the N-type epitaxial layer by means of photolithography and ion implantation processes. The bottom of the P-type body region is located in the N-type carrier injection layer.

The source region is formed at the top of the P-type body region by means of photolithography and ion implantation processes.

Figure 6:
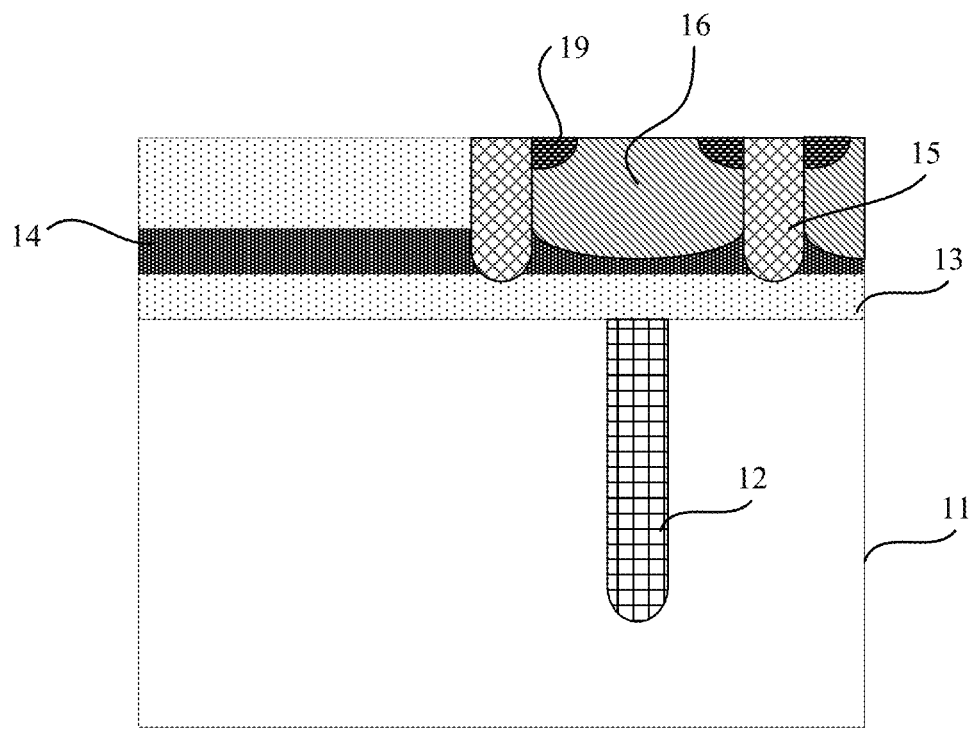
FIG. 6 is a sectional view of the device with a cell unit formed in the N-type epitaxial layer provided by the embodiment of the present application.

Referring to FIG. 6, the trench gate 15 and the P-type body region 16 are formed in the N-type epitaxial layer 13, the source region 19 is formed at the top of the P-type body region 16, and the bottom of the P-type body region 16 is located in the N-type carrier injection layer 14.

Step 205. A collector region is formed at the bottom of the N-type substrate.

The substrate is thinned, and ion implantation is performed on the thinned substrate to form the P-type doped collector region.

To sum up, in the method for manufacturing an IGBT device provided by the embodiment of the present application, the super junction structure is formed in the N-type substrate, the N-type epitaxial layer is formed on the surface of the N-type substrate, and the N-type carrier injection layer is formed in the N-type epitaxial layer, the N-type carrier injection layer is spaced apart from the N-type substrate by the N-type epitaxial layer, the cell unit of the IGBT device is formed in the N-type epitaxial layer, and the collector region is formed in the N-type substrate, achieving the effects of increasing the hole concentration, reducing the on-state voltage drop of the IGBT device, and improving the performance of the device.

Figure 7:
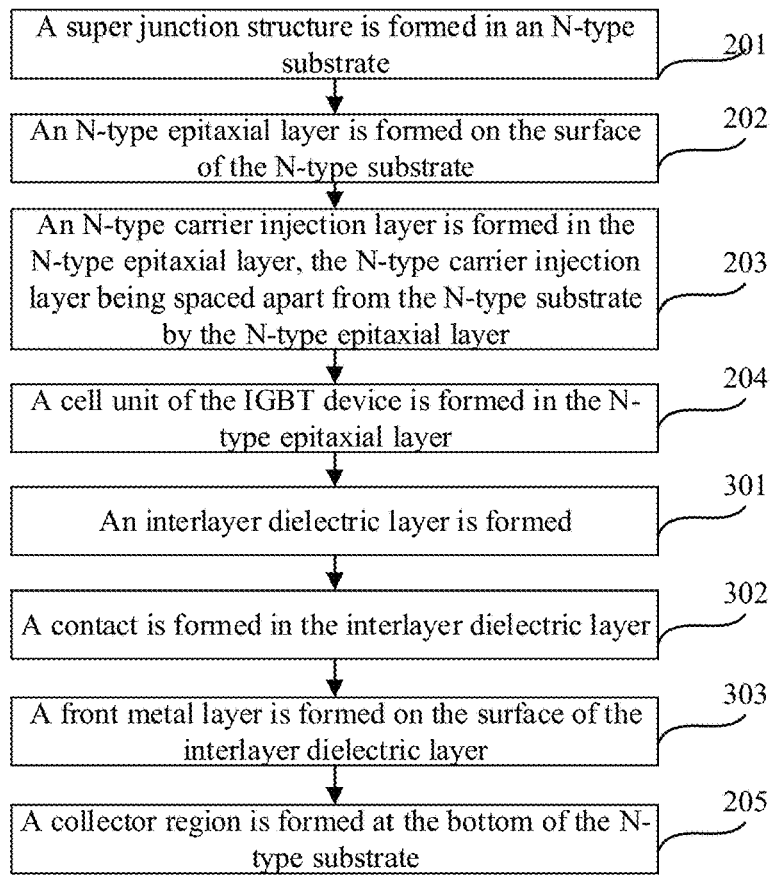
FIG. 7 is a flowchart of a method for manufacturing an IGBT device provided by another embodiment of the present application.

In an optional embodiment based on the embodiment shown in FIG. 2, before the collector region is formed at the bottom of the N-type substrate, i.e., before step 205, a front process of the method further includes the following steps, as shown in FIG. 7.

Step 301. An interlayer dielectric layer is formed.

Figure 8:
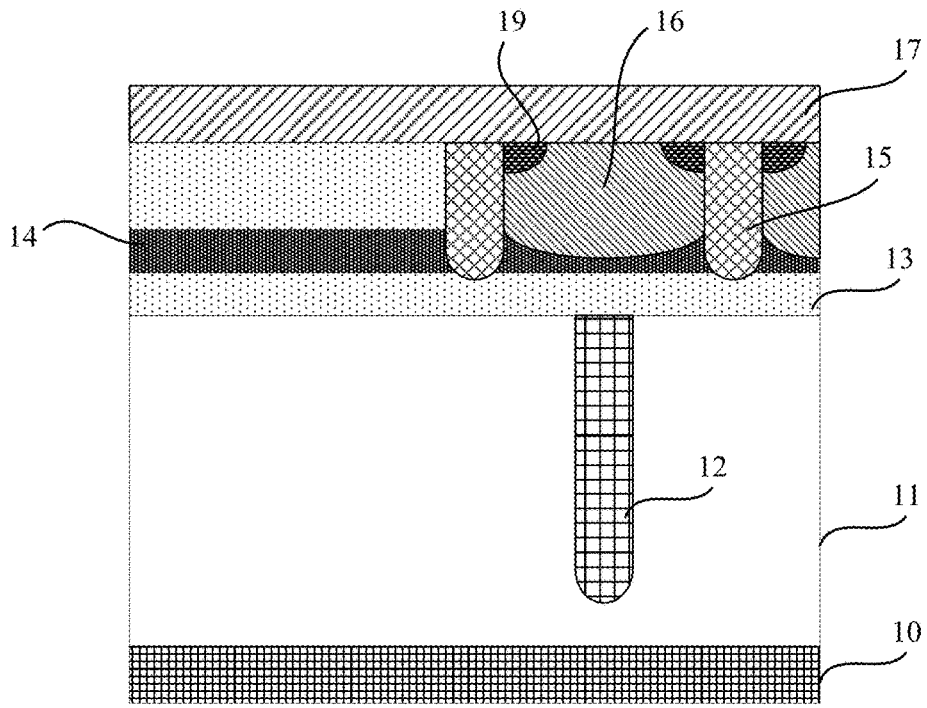
FIG. 8 is a sectional view of the device with a formed interlayer dielectric layer provided by the embodiment of the present application.

Referring to FIG. 8, the interlayer dielectric layer 17 is formed on the surface of the N-type epitaxial layer 13.

Step 302. A contact is formed in the interlayer dielectric layer.

The contact is formed in the interlayer dielectric layer by means of photolithography and etching processes, and the source region and the trench gate are led out by means of the contact.

Step 303. A front metal layer is formed on the surface of the interlayer dielectric layer.

The source region and the trench gate in the cell unit are connected to the front metal layer by means of the contact.

A front metal is deposited on the surface of the interlayer dielectric layer, and the front metal is patterned to form the front metal layer. The source region is connected to the front metal layer by means of the contact, so as to form an emitter of the IGBT device. The trench gate is connected to the front metal layer by means of the contact, so as to form the gate of the IGBT device.

After the front process is completed, a back process is performed. That is, the substrate is thinned, and ion implantation is performed on the back of the N-type substrate to form the P-type collector region 10, as shown in FIG. 1.

A back metal layer is formed on the bottom surface of the N-type substrate 11, and the back metal layer and the collector region 10 form a collector of the IGBT device.

Optionally, the formation of the N-type carrier injection layer in the N-type epitaxial layer may be implemented in the following manner:

N-type dopant ions are implanted into the N-type epitaxial layer by means of an ion implantation process, so as to form the N-type carrier injection layer.

In an example, the N-type dopant ions are phosphorus ions.

In an example, in the process of forming the N-type carrier injection layer, an ion implantation dose is 1E11-1E14 $cm^{-2}$, and ion implantation energy is 1-3 MeV.

Optionally, the formation of the cell unit of the IGBT device in the N-type epitaxial layer, i.e., step 204, may be implemented by the following steps:

Step 2041. A trench gate is formed in the N-type epitaxial layer.

Step 2042. A P-type body region is formed outside the trench gate, the bottom of the P-type body region being located in the N-type carrier injection layer.

Step 2043. A source region is formed at the top of the P-type body region.

Figure 9:
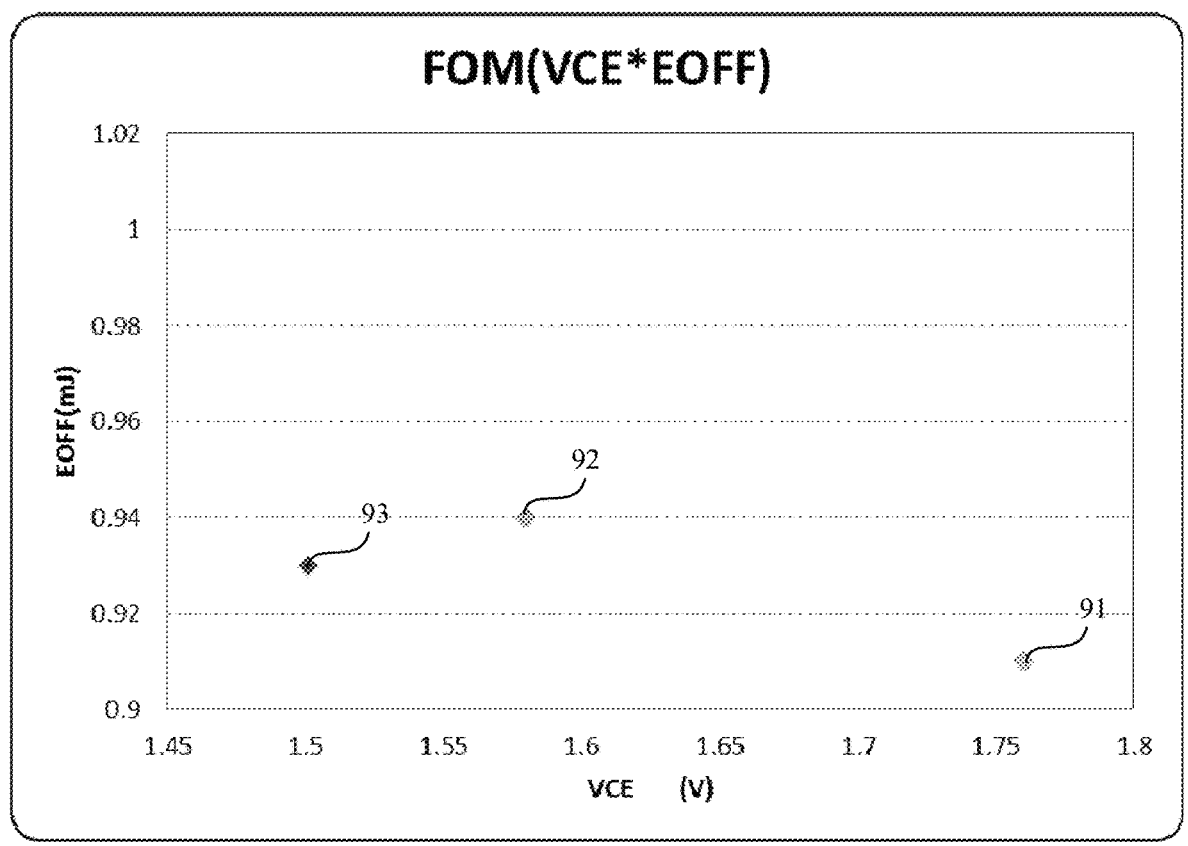
FIG. 9 is a comparative schematic diagram of FOM (VCE*EOFF) values of the IGBT device provided by the embodiment of the present application.

In an example, FOM (VCE*EOFF) measurement is performed on the IGBT device provided by the embodiment of the present application, an existing super-junction-based IGBT device, and an existing MPT-type IGBT, wherein the three IGBT devices are of the same size, VCE represents a saturation voltage, and EOFF represents a switching energy consumption parameter of the IGBT. Referring to FIG. 9, dot 91 represents the FOM of the existing MPT-type IGBT, dot 92 represents the FOM of the existing super-junction-based IGBT device, and dot 93 represents the FOM of the IGBT device provided by the embodiment of the present application. It can be seen that, by adding the N-type carrier injection layer, the FOM value of the IGBT device provided by the embodiment of the present application is increased by 15% compared with the FOM value of the existing MPT-type IGBT, and is increased by 5% compared with the FOM value of the existing super-junction-based IGBT device.

Obviously, the above embodiments are merely examples used for clear description, rather than for limitation on the implementations. Those skilled in the art could also make other changes or modifications in different forms on the basis of the above description. There is no need or way to exhaustively list all of the implementations herein, but obvious changes or modifications derived herefrom still fall within the protection scope created by the present application.

What is claimed is:

1. An IGBT device, comprising:
   a super junction structure, the super junction structure being composed of several N-type pillars and P-type pillars arranged alternately, and the super junction structure being located in an N-type substrate;
   a cell unit of the IGBT device, the cell unit being located in an N-type epitaxial layer, and the N-type epitaxial layer being located above the N-type substrate;
   each cell unit comprising a trench gate, a P-type body region, and a source region at the top of the P-type body region;
   an N-type carrier injection layer, the N-type carrier injection layer being located in the N-type epitaxial layer, and the N-type carrier injection layer being spaced apart from the N-type substrate by the N-type epitaxial layer;
   the bottom of the P-type body region being located in the N-type carrier injection layer; and
   a collector region, the collector region being located at the bottom of the N-type substrate.

2. The IGBT device according to claim 1, further comprising an interlayer dielectric layer and a front metal layer, wherein
   the interlayer dielectric layer is located above the N-type epitaxial layer, and the front metal layer is located on the surface of the interlayer dielectric layer; and
   a contact is formed in the interlayer dielectric layer, and the source region and the trench gate are connected to the front metal layer by means of the contact.

3. The IGBT device according to claim 1, wherein a doping impurity of the N-type carrier injection layer is phosphorus.

4. A method for manufacturing an IGBT device, wherein the method comprises:
   forming a super junction structure in an N-type substrate, the super-junction structure being composed of several N-type pillars and P-type pillars arranged alternately;
   forming an N-type epitaxial layer on the surface of the N-type substrate;
   forming an N-type carrier injection layer in the N-type epitaxial layer, the N-type carrier injection layer being spaced apart from the N-type substrate by the N-type epitaxial layer;
   forming a cell unit of the IGBT device in the N-type epitaxial layer, each cell unit comprising a trench gate, a P-type body region, and a source region located at the top of the P-type body region, and the bottom of the P-type body region being located in the N-type carrier injection layer; and
   forming a collector region at the bottom of the N-type substrate.

5. The method according to claim 4, wherein the forming an N-type carrier injection layer in the N-type epitaxial layer comprises:
   implanting N-type dopant ions into the N-type epitaxial layer by means of an ion implantation process, so as to form the N-type carrier injection layer.

6. The method according to claim 5, wherein the N-type dopant ions are phosphorus ions.

7. The method according to claim 5, wherein in the process of forming the N-type carrier injection layer, an ion implantation dose is 1E11-1E14 $cm^{-2}$, and an ion implantation energy is 1-3 MeV.

8. The method according to claim 4, wherein the forming a cell unit of the IGBT device in the N-type epitaxial layer comprises:
   forming a trench gate in the N-type epitaxial layer;
   forming a P-type body region outside the trench gate, the bottom of the P-type body region being located in the N-type carrier injection layer; and
   forming a source region at the top of the P-type body region.

9. The method according to claim 4, wherein the method further comprises:
   forming an interlayer dielectric layer;
   forming a contact in the interlayer dielectric layer; and
   forming a front metal layer on the surface of the interlayer dielectric layer, the source region and the trench gate in the cell unit being connected to the front metal layer by means of the contact.

* * * * *